United States Patent [19]

Hoffman et al.

[11] Patent Number: 4,797,623
[45] Date of Patent: Jan. 10, 1989

[54] TESTER FOR FIRE-SUPPRESION COMPONENTRY

[75] Inventors: Steven L. Hoffman, Macomb; Robert L. Rammage, Wayne, both of Mich.

[73] Assignee: The United States of America as represented by the Secretary of the Army, Washington, D.C.

[21] Appl. No.: 39,186

[22] Filed: Apr. 16, 1987

[51] Int. Cl.$^4$ ............................................. G01R 31/02
[52] U.S. Cl. ................................... 324/556; 324/527; 324/66; 324/133
[58] Field of Search ................. 324/66, 542, 556, 539, 324/527, 133, 540

[56] References Cited

U.S. PATENT DOCUMENTS

| | | | |
|---|---|---|---|
| 2,810,881 | 10/1957 | Daily | 324/542 |
| 4,203,066 | 5/1980 | Buck | 324/538 |
| 4,326,162 | 4/1982 | Hankey | 324/542 |
| 4,418,312 | 11/1983 | Figler | 324/542 X |

FOREIGN PATENT DOCUMENTS 1019372  5/1983  U.S.S.R. ............................ 324/540

Primary Examiner—Reinhard J. Eisenzopf
Assistant Examiner—Robert W. Mueller
Attorney, Agent, or Firm—Peter A. Taucher; David L. Kuhn

[57] ABSTRACT

A testing implement that can be electrically connected to a test-alarm panel in a vehicle fire-suppression system for verifying the integrity of the panel circuitry. The testing implement can be used with the test-alarm panel installed in a vehicle or outside the vehicle (i.e., bench testing). The implement can also be used to test the integrity of electrical cables used in the fire-suppression system.

1 Claim, 5 Drawing Sheets

TESTER FOR FIRE-SUPPRESION COMPONENTRY

GOVERNMENT INTEREST

The invention described herein may be manufactured, used, and licensed by or for the Government for governmental purposes without payment to us of any royalty thereon.

SUMMARY OF THE INVENTION

This invention relates to an electrical tester device, particularly a device designed to test circuitry in an electrical control system for a vehicle fire suppression system.

Military vehicles (tanks and armoured personnel carriers) are sometimes equipped with protective systems for combatting explosive fires generated by enemy action, especially fires generated when an enemy projectile passes through the vehicle fuel storage container. Without such protection systems the exploding liquid fuel can quickly disable the vehicle, and injure or kill military personnel within the vehicle.

One known protective system comprises a number of optical fire sensors arranged in the vehicle to sense the presence of an emergent fireball resulting from the passage of an enemy projectile into the vehicle fuel storage container. The sensors are electrically connected to a plural number of electrically-operated valves carried on pressure-resistant bottles containing pressurized fire suppressant (monobromotrifluoromethane or other vaporizable fire suppressant).

The valves control flow of fire-suppressant from the bottles into a piping system leading to the vehicle space occupied by the fuel storage container. Should one or more sensors detect an emergent fireball, a signal is sent to an electronic amplifier, which transmits an amplified signal to a selected one of the aforementioned valves. The selected valve is automatically opened to permit fire-suppressant to flow from the associated bottle through the piping system, to thereby extinguish the fireball before it can seriously damage the vehicle or harm the military personnel. The extinguishing process takes about 200 milliseconds, measured from the initial optical signal to a fire-out condition.

These fire-suppression systems are equipped with testalarm panels designed to apprise the vehicle driver or commander of the condition of the system, e.g., operability of the sensors, presence or absence of satisfactory pressure in the fire-suppressant bottles, operability of the amplifier, etc. The test-alarm panels also include indicator lamps and manual switches for enabling the driver or commander to manually open one of the fire-suppressant valves should the automatic system fail to operate in the intended manner.

It is essential to proper operation of the system that the test-alarm panel remain in good working order, to protect and warn the crew during battlefield operations. The present invention relates to a tester device for establishing the integrity of electrical circuits within the test-alarm panel.

The tester device is designed as a tubular hand-held implement, about 1 ½ inches in diameter and four inches long, such that the implement can be operatively connected to the test-alarm panel without removing the panel from the vehicle. However, the tester implement can also be used with the test-alarm panel removed from the vehicle, e.g., for bench test operations on the panel.

The existing fire suppression system components (alarm panel, amplifier, optical sensors and fire-suppressant bottles) are located in different areas of the vehicle. Such components are operatively interconnected by flexible cables. Our improved tester is designed so that it can be used to test the integrity of the conductors in the main cable that interconnects the panel and amplifier.

A principal aim of our invention is to provide a multi-use electrical tester that can be used to test the circuit integrity of the fire-suppression alarm panel and also the main cable assembly.

Another aim of the invention is to provide a tester that is manufacturable as a small size item, whereby the tester can be used within a military vehicle, i.e., without removing the fire suppression componentry from the vehicle.

THE DRAWINGS

Figure 1:
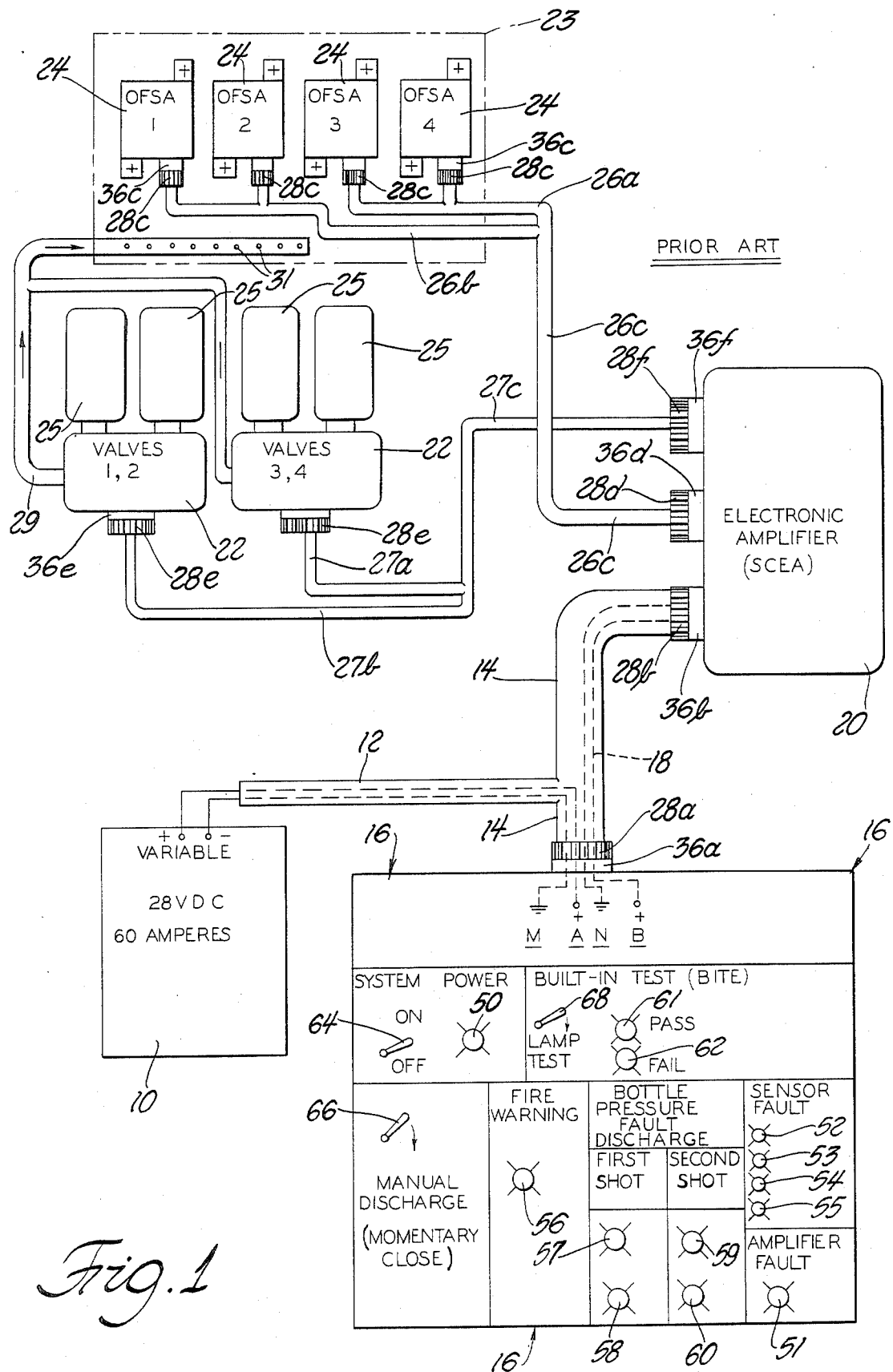
FIG. 1 is a diagrammatic illustration of an existing fire-suppression system used in a military vehicle.

FIG. 1 schematically illustrates a fire suppression system used in a military tank. The system is designed to protect the soldiers within the tank from fires generated as a result of enemy action, especially explosive fires resulting from an enemy hit on the fuel storage units in the tank In one particular tank there are two fuel storage units (containers) arranged in the engine compartment 23 alongside the engine. A number of optical fire sensors 24 are arranged in corner areas of the compartment to optically detect the existence of an emergent fireball, resulting from the passage of an enemy projectile through one or both of the fuel storage containers.

The fire suppression system includes a plural number of pressure-resistant storage bottles 25 located remote from the engine compartment (e.g., at or near the driver station); each bottle contains pressurized fire suppressant (monobromotrifluoromethane). At least some of the bottles are connected to a piping system 29 for transporting pressurized fire suppressant from the bottles into the engine compartment. Two or more horizontal perforated pipes 31 in the engine compartment 23 are designed to spray vaporized fire suppressant into the zones adjacent to the fuel storage containers (between the containers and the engine).

Each of the aforementioned storage bottles 25 is equipped with an electrically-operated valve 22 (solenoid or explosive squib) for controlling flow of fire suppressant from the bottle into the associated piping system. During normal operations (standby periods) the various valves are closed.

Should a fireball develop in the engine compartment, one or all of the optical sensrs generate an alarm signal. The signal is passed through an electronic amplifier 20 to selected ones of the aforementioned electrically-operated valves 22. One or more valves are automatically opened to enable the pressrrized fire suppressant to be sprayed into the engine compartment, to thereby extinguish the fireball before it can propagate into unmanageable proportions.

The system is designed to produce a fire-out condition within a short period of time (.e.,g 200 milliseconds), measured from the initial optical flash (emergent fireball).

The fire suppression system includes a back-up mechanism for manually opening one or more fire suppressant valves in the event that the automatic system fails to function. The back-up mechanism comprises a manual electric switch 66 on a panel 16 located at the driver station; a similar panel (not shown) may be located at the commander's station. When the switch is manually closed a triggering signal is delivered to a selected valve, to thereby produce the desired flow of pressurized fire suppressant into the engine compartment.

A test-alarm panel 16 has been developed to assure continued operability of the fire suppressant system. The test-alarm panel provides the following functions:

1. testing for input voltage to the panel.
2. testing for amplifier output voltage (coming back to the panel).
3. testing for integrity of the optical fire sensor circuits.
4. visual indication that an electrical signal has been generated by an optical sensor.
5. manual actuation switch for discharging a fire-suppressant bottle.
6. visual indication of insufficient pressure in fire-suppressant bottles 25.
7. testing for indicator lamp integrity in panel 16.

FIG. 1 shows some features of a fire suppression system equipped with a test-alarm panel 16. The system includes a D.C. voltage source 10 connected to a cable 12 containing a positive wire and a negative (ground) wire. Cable 12 joins another cable (or conduit) 14 that extends between an electrical amplifier 20 and a test-alarm panel (box) 16.

Cable 14 has eighteen conductors therein electrically joined to individual sockets in a multi-socket end connector 28a; each conductor is connected to a separate socket element in device 28a. A conventional electrical plug structure 36a is suitably mounted on the side wall of panel 16 for removable reception of socket connector 28a; plug structure 36a comprises eighteen electrical pins, one for each socket in device 28a. The various pin-socket connections serve as connection points for flow of electrical current between the three electrical components, i.e., voltage source 10, amplifier 20 and panel 16. Socket structure 28a can be removed (detached) from plug structure 36a, e.g., for repair or replacement of the cables, panel, etc.

The aforementioned wires in cable 12 continue along cable 14 to terminate as power-in connections M and A in panel 16. Connection point A (one of the aforementioned pins) delivers voltage to circuitry within panel 16. Connection point M (another one of the aforementioned pins) serves as a grounding connection for the panel 16 circuitry.

Cable 14 has sixteen conductors therein electrically joined to individual sockets in a second socket structure 28b (at the other end of the cable). Individual sockets register with pin connectors in a second plug structure 36b that is suitably mounted on one wall of electronic amplifier 20. Socket structure 28b can be disconnected from plug structure 36b when necessary for repair or replacement purposes.

The fire suppression system includes four optical fire sensors 24 located in the vehicle engine compartment 23. Sensors 24 have detachable electrical connections 28c with electrical cables 26a and 26b that branch out from a cable 26c. Cable 26c has a detachable connection 28d with a plug structure 36d on amplifier 20.

The fire suppression system includes four electrically-operated valves 22 carried on fire-suppressant storage bottles 25. Each valve 22 is normally closed to prevent outflow of pressurized fire suppressant from the associated bottle into a piping system 29. As indicated previously, the piping system includes perforated piping 31 arranged in engine compartment 23, so that when a selected valve 22 is opened the pressurized fire suppressant is sprayed into the engine compartment to extinguish the fireball initially sensed by sensors 24. Valves 22 have detachable connections 28e, 36e with cable means 27a, 27b, 27c that extend from amplifier 20.

The various electrical end connectors 28a, 28b, 28c, 28d, 28e and 28f are all of generally the same construction, comprising a number of electrical socket elements suitably anchored within a dielectric wall structure that is affixed to an end of the associated insulated flexible cable; the number of socket elements varies from one end connector to another, depending on the cable function.

The various plug structures 36a, 36b, 36c, 36d, 36e and 36f are all of generally the same construction, comprising electrical pin connectors projecting from an exterior face of a dielectric wall structure carried on the respective electrical component (panel 16, amplifier 20, etc.). Each cable end connector 28 can be detached from the associated plug structure 36, as necessary for installation, maintenance or repair purposes.

The various components may be located in different areas of the vehicle, e.g., panel 16 can be located near the driver station, the amplifier can be located beneath the turret, sensors 24 are located in the engine compartment, etc. The various flexible cables 12, 14, etc. operatively interconnect the various components.

In operation, voltage source 10 delivers electrical power through cable 12 to circuitry within panel 16. Power is outputed from panel 16 through a wire in cable 14 to amplifier 20. The amplifier has cable connections 26a, 26b and 26c to/from the sensors 24, whereby the amplifier receives and develops an amplified fire-warning signal. The amplified signal is delivered through cable means 27c, 27a and 27b to selected ones of valves 22. The valves are thus opened to produce a fire-out condition in engine compartment 23, usually within about 200 milliseconds starting from the initial warning signal by sensors 24.

FIG. 2 CIRCUITRY

Figure 2:
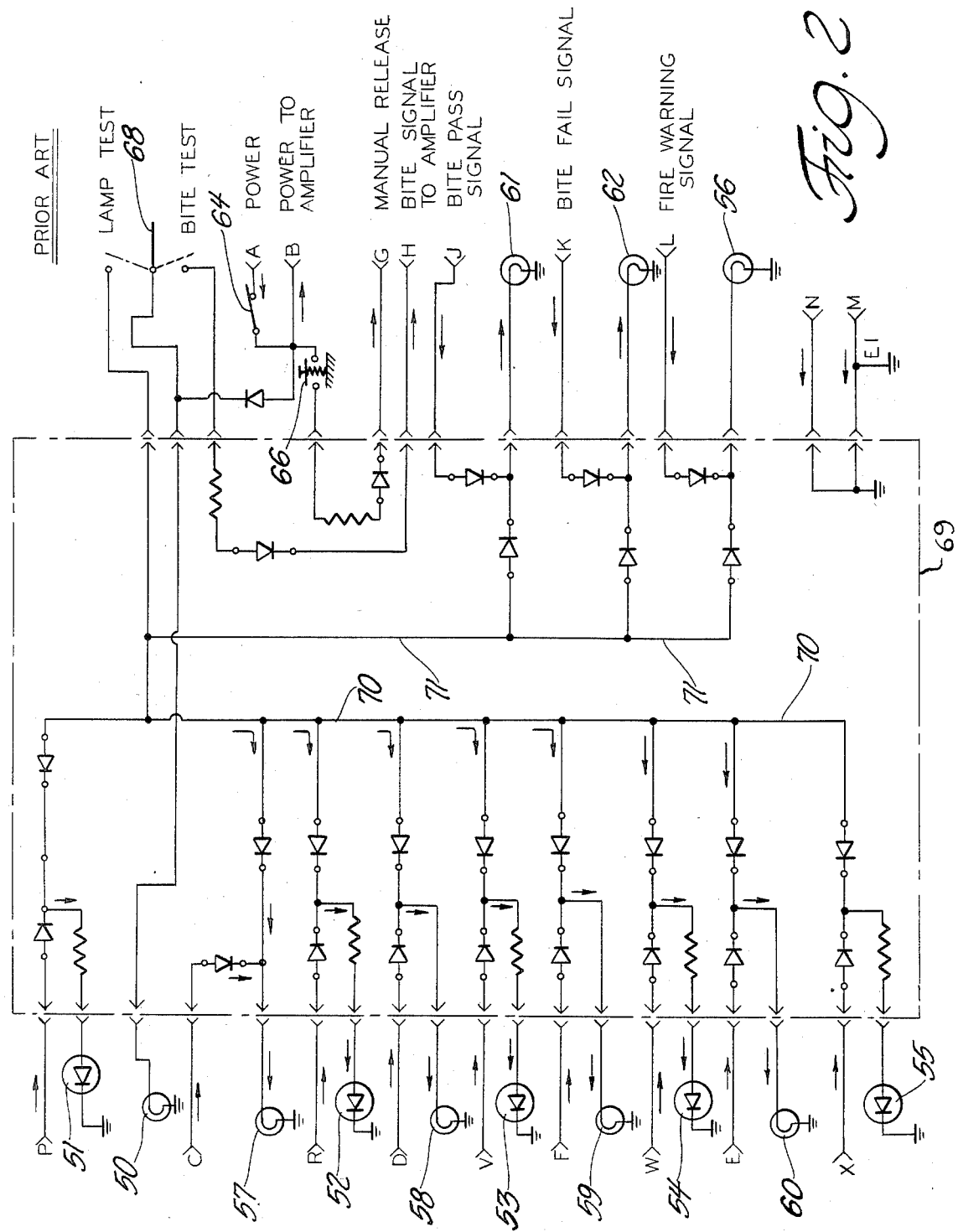
FIG. 2 is a circuit diagram, showing circuitry within a panel (box) forming part of the FIG. 1 fire-suppression system.

FIG. 2 schematically illustrates circuitry housed within panel 16 (FIG. 1). The circuitry includes thirteen indicator lamps identified by the numerals 50, 51, 52, 53, 54, 55, 56, 57, 58, 59, 60, 61 and 62. Lamps 51, 52, 53, 54 and 55 are shown as light-emitting diodes. The FIG. 2 circuitry also includes three manual switches 64, 66 and 68. Switch 64 is an on-off (single pole) switch. Switch 66 is a normally off, momentarily closed switch. Switch 68 is a three way selector switch The FIG. 2 circuitry includes three power-out connection points, and fifteen power-in connection points. The three power-out connection points are identified in FIG. 2 by the letters B, G and H. The fifteen power-in connection points are identified in FIG. 2 by the letters A, J, K, L, N, M, P, C, R, D, V, F, W, E, and X. Connection M and N are connected together to function as a grounding path for the conductors extending to voltage source 10 and amplifier 20.

The eighteen listed connection points constitute the various electrical pins contained within plug structure 36a (FIG. 1). Current flow direction and magnitude are controlled by diodes and resistors suitably mounted on a circuit board 69 contained within panel 16; the board is indicated by dashed lines in FIG. 2.

The test-alarm panel 16 can be used or operated in the following fashion:

To test for power delivery from source 10 to panel 16, switch 64 is manually closed, and switch 68 is opened. Power is inputed to the panel through connection point A. If power is being received at the panel lamp 50 is lit.

To test for power delivery from panel 16 through amplifier 20, switch 64 is again closed and switch 68 is again opened. If the amplifier is delivering power back to panel 16 lamp 51 will light. Current will flow to the amplifier via connection B; current will return from the amplifier via connection P.

To test for power delivery to the optical fire sensors 24, switch 64 is closed, and switch 68 is set to the BITE test position. Lamps 52, 53, 54 and 55 should light. Current will flow from panel 16 via connection H; current will return to the panel through connections R, V, W and X.

The test-alarm panel 16 is also designed to provide information during a fire extinguisher action, i.e., when sensors 14 generate an alarm signal. When sensors 24 deliver signals to valves 22 (to extinguish a fireball in the engine compartment) lamp 56 will be lit via connection L. Assuming switch 64 is in the closed "power on" position, current will flow to amplifier 20 via connection B. Current generated by one of sensors 24 will return to panel 16 via connection L.

During the fireball-extinguishing process the pressure in one or more of the fire-suppressant bottles will drop from its normal "high" value, of about 750 p.s.i.g., to a lower value, near atmospheric pressure (due to outflow of fluid from the bottle). One of lamps 57, 58, 59 or 60 should light up. Pressure switches on the fire-suppressant bottles will deliver "fault discharge" signals through amplifier 20 back to panel 16 at connection points C, D, F and E.

If lamp 56 lights up, but none of lamps 57, 58, 59 and 60 light up, the vehicle operator knows that the automatic system has failed to extinguish the fire. He is pre-instructed to then manually close switch 66. A signal is delivered through connection G to one of the valves. If the valve-open action is successful one of lamps 59 and 60 will be lit through connection points F or E.

The test-alarm panel 16 is also designed to provide information on the state of pressurization of bottles 25 (prior to a fire emergency); indicator lamps 57, 58, 59 and 60 connected to pressure switches carried on bottles 25. If any one of lamps 57, 58, 59 or 60 lights, while fire-warning light 56 remains dark, then the operator knows that the respective fire-suppressant bottle is in a discharged (inoperable) condition. The bottle-valve system should be serviced, e.g., recharge the bottle, replace a leaking valve, etc.

The integrity of the lamps on panel 16 may be checked by turning switch 68 to the "lamp test" position (with switch 64 in the closed "power on" position). Power is delivered to the various lamps 50-62 through distribution lines 70 and 71. If any lamp fails to light that lamp should be replaced.

FIG. 3 CIRCUITRY

Figure 3:
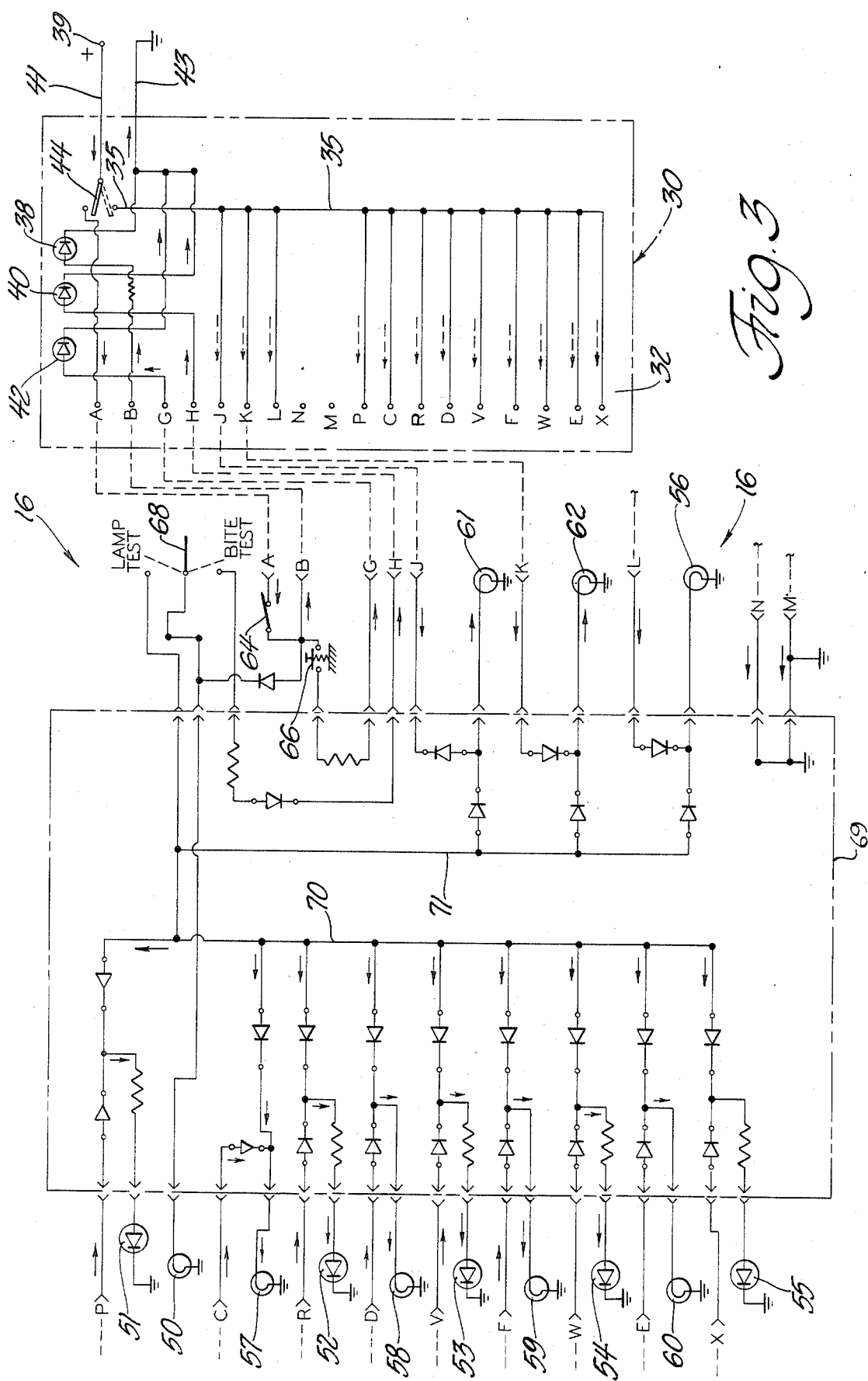
FIG. 3 is a diagram, showing the FIG. 2 circuitry, together with a tester circuit constructed according to our invention.
Figure 4:
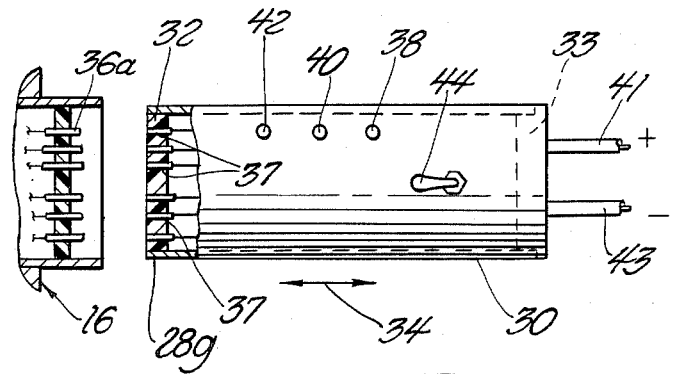
FIG. 4 is an exterior view of a hand-held implement embodying the tester circuitry shown in FIG. 3.

FIG. 3 depicts the FIG. 2 circuitry, together with additional circuitry contained within an add-on tester housing 30 (shown in FIG. 4). The tester circuitry is used to test the integrity of the panel 16 circuitry, so that when panel 16 is put into service we can be assured that it is operable. Tester housing 30 is a plug-on device that is temporarily plugged onto panel 16 in place of cable 14 (FIG. 1). Indicator lamps 38, 40 and 42 on housing 30 denote operability/inoperability of various circuits within panel 16. When panel 16 has been ascertained as an operable unit, housing 30 is removed from the panel, and cable 14 is reconnected to plug structure 36a As shown in FIG. 4, tester housing 30 comprises a tubular housing structure having a right end wall 33 and left end wall 32. Openings in wall 33 accommodate lead wires 41 and 43 that are connectable to a suitable auxiliary (temporary) voltage source. End wall 32 is a dielectric material having eighteen electrical sockets 37 mounted therein, to form a connector structure 28g similar to aforementioned connector 28a; in practice structures 28a and 28g are identical.

Each socket 37 has a conductor wire soldered thereto. The various conductors are wired to a switch 44 and the three indicator lamps 38, 40 and 42, as shown generally in FIG. 3.

Wall 32 and sockets 37 are sized to act as a plug-on socket device 28g matable with plug structure 36a carried on panel 16. Housing 30 may be advanced leftwardly (FIG. 4) to plug onto plug structure 36a, whereby the circuitry within housing 30 is electrically connected to the circuitry within panel 16. When tester housing 30 has performed its function it may be manually removed from panel 16.

Tester 30 is designed to duplicate the action of cable 14 (and associated components 10, 20, 24 and 22), so that electrical faults in panel 16 are uncovered. By verifying the electrical integrity of panel 16 we are assured that if the panel later signals a defect in the vehicle fire-suppression system the defect is in fact in the vehicle system and not in panel 16. In FIG. 3 the eighteen socket connections 37 are identified by the letters A, B, G, H, J, K, L. N, M, P, C, R, D, V, F, W, E and X within the dashed lines 30 (representing the tester housing). Each socket connector is electrically connected to a similarly lettered connector on panel 16. The three indicator lamps 38, 40 and 42 are in series connection with respective ones of panel 16 connection points B, H, and G; these connection points are the three power-out connection points. Indicator lamps 38, 40 and 42 are used to verify the integrity of the power-out circuits in panel 16.

Manual switch 44 can be set in either of two positions. In one position the switch connects voltage source 39 with panel 16 connection point A and the associated circuitry. In a second position (dashed line in FIG. 3) switch 44 connects voltage source 39 to a distribution line 35 and all of the associated connection points J, K, L. P. C, R, D, V. F, W, E and X in panel 16. With switch 44 in the dashed line position tester 30 can be used to test the integrity of the power-in connections in panel 16.

Assuming switch 44 is in its full line position ( and switch 64 is closed) a circuit is established from source 39, through connection point A, switch 64, and lamp 50. A branch circuit is established through connection point B and indicator lamp 38. By closing switch 66 another circuit is established through connection point G and indicator lamp 42. By setting switch 68 to the BITE test position another circuit is established through connection point H and indicator lamp 40.

The three indicator lamps 38, 40 and 42 test the integrity of the panel 16 circuits associated with power-out connections B, G, and H.

Assuming switch 44 is adjusted to its dashed line position, circuits are established from distribution line 35 through the panel 16 circuits associated with lamps 61, 62, 56, 51, 57, 52, 58, 53, 59, 54, 60 and 55.

The add-on tester 30 provides a test vehicle for the various switches and lamps in test-alarm panel 16. Tester 30 can be used with panel 16 in its installed position in the vehicle (after disconnecting cable 14 from the panel). Alternately, tester 30 can be used with panel 16 removed from the vehicle, i.e., a bench test during initial panel 16 manufacture or panel 16 repair.

FIG. 7 CONSTRUCTION

Figure 7:
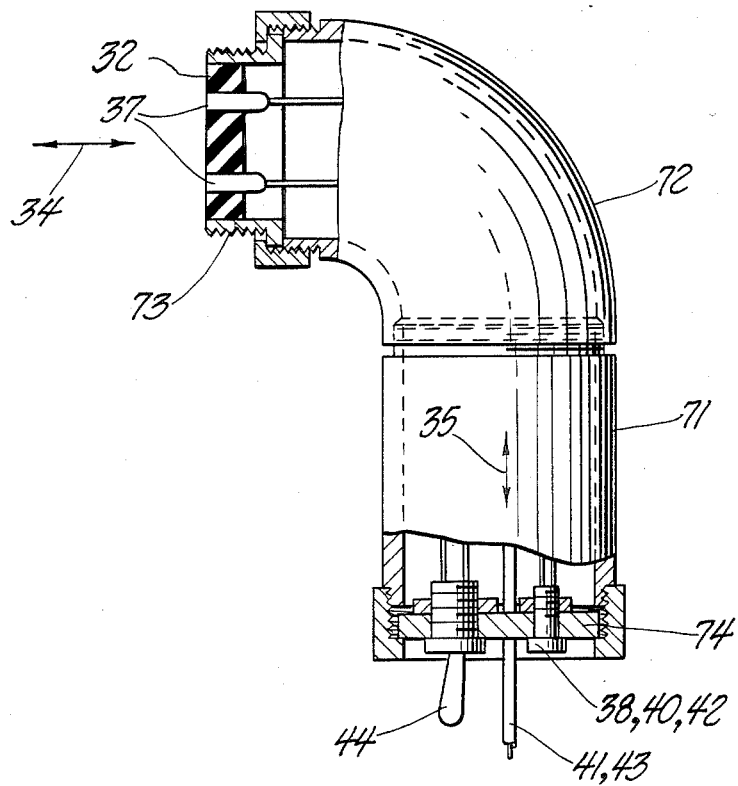
FIG. 7 is an exterior view of an alternative tester configuration that may be used in lieu of the tester configuration shown in FIG. 4.

The tester device shown in FIG. 4 is an elongated structure having a relatively long dimension (e.g., five inch) in the axial direction. The FIG. 4 device is installed or removed by an axial motion in the axial (arrow 34) direction. Unfortunately in some existing vehicles (tanks) panel 16 is semi-obstructed behind other equipment (at the driver station or at the commander station in the turret). It is not feasible to plug the FIG. 4 tester onto panel 16 without first removing other equipment from the adjacent area. 10 FIG. 7 illustrates an alternative tester configuration designed for plug-on connection to a test-alarm panel 16 in the vehicle, without first removing other equipment. The FIG. 7 tester is electrically the same as the FIG. 4 tester.

The FIG. 7 tester comprises a straight tubular housing section 71 suitably connected to a curved tubular housing section 72. The various electrical sockets 37 are mounted on a dielectric wall 32 located in an add-on connector housing 73. Switch 44 and the three indicator lamps 38, 40 and 42 are mounted on a housing end wall 74.

In use, the FIG. 7 tester is installed on (or removed from) test-alarm panel 16 by movement in the arrow 34 direction, i.e., at right angles to the major dimension of the tester housing. Only a relatively small free space in the arrow 34 direction is required to install or remove the tester.

The tester can have a transverse dimension (arrow 34 direction) on the order of two inches, and an axial dimension (arrow 35 direction ) on the order of four inches. The relatively small axial dimension is made possible by the fact that switch 44 and the three indicator lamps are mounted on an end wall 74 of the housing rather than along the housing side wall.

When switch 44 and lamps 38, 40 and 42 are mounted on the housing side wall (as in FIG. 4) the eight lead wires for these components must be relatively long in order to make the various electrical connections with sockets 37 and wires 41 and 43. The electrical connections are made with walls 32 and 33 disconnected from the tubular housing. When walls 32 and 33 are subsequently attached to the tubular housing the relatively long wires must collapse into the defined housing space. The housing must have sufficient length to accommodate the collapsed wire volume.

By way of further explanation, when switch 44 and lamps 38, 40 and 42 are mounted on housing end wall 74 (as in FIG. 7) the various wires do not have to be quite so long (as in the FIG. 4 arrangement). The wires can be loosely trained through housing sections 71 and 72, with wall structures 73 and 74 in disconnected attitudes; the back (inner) surface of wall 74 is readily accessible for wire soldering purposes. Relatively short wiring lengths can be used in the FIG. 7 arrangement, such that a relatively short housing structure can be used, while still accommodating the collapsed wire volume.

ARRANGEMENT OF FIGS. 5 AND 6

Figure 5:
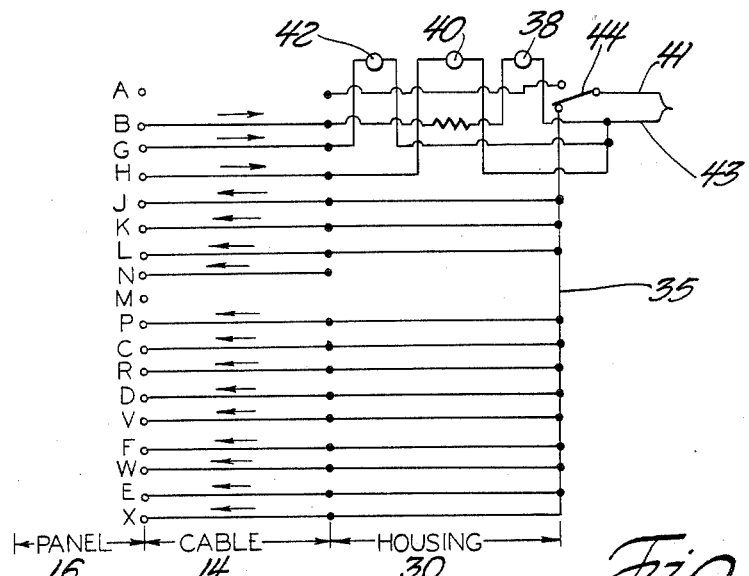
FIG. 5 is a simplified circuit diagram, showing the FIG. 3 tester circuit, as used to test a cable mechanism that forms part of the FIG. 1 fire-suppression system.
Figure 6:
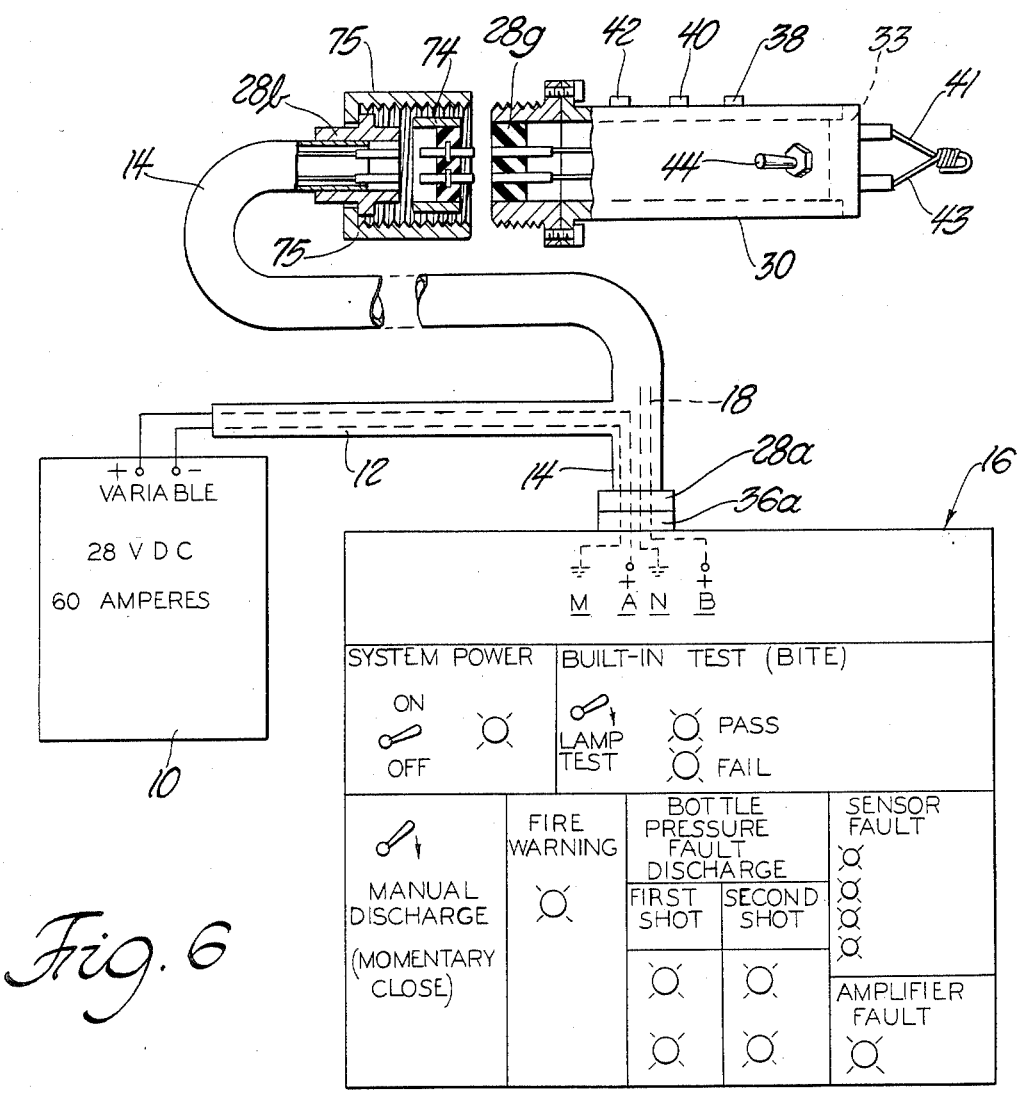
FIG. 6 is a simplified structural illustration of the FIG. 5 test system circuitry, showing the physical arrangement employed to perform a cable test.

The testers shown in FIGS. 4 and 7 are designed to test the circuitry in a test-alarm panel 16. However these testers can also be used to test the integrity of the electrical wiring in cable 14. FIGS. 5 and 6 illustrate generally how a cable test can be accomplished.

It will be noted from FIG. 1 that cable 14 normally has one end thereof connected to amplifier 20. To test the integrity of the cable the cable is first disconnected from the amplifier (but still connected to test-alarm panel 16, cable 12 and voltage source 10). Tester 30 (or the alternate tester of FIG. 7) is then connected to cable 14 in place of amplifier 20; the tester sees the same voltage conditions as it did when testing panel 16 (FIG. 3) except that cable 14 is interposed between panel 16 and the tester. If we assume a good (operable) panel 16 and a good (operable) tester 30, then the test set-up can be used to test the integrity of the wiring in cable 14 (and associated cable 12).

The cable 14 end connector for connection with amplifier 20 has female (socket) connections 28b. Also, tester 30 has female (socket) connections 28g. Therefore, in order to operatively connect tester 30 to the "amplifier" end of cable 14, it is first necessary to change the tester 30 connections from the "socket" type to the "pin" type. FIG. 6 shows a pin-like adapter means 74 interposed between the cable end and tester 30. The protruding ends of the pins in adapter means 74 are designed to fit into the sockets on the confronting ends of the cable and tester 30, to form conductive paths for the various circuits in the cable and tester. A conventional nut 75 may be swivel mounted on connector 28b for mechanical screw-type locking action on connector 28g.

Adapter means 74 is shown as a specially-constructed pin-type unit. In event that cost considerations should rule out the use of such a special unit, it is possible to build up an equivalent adapter by wiring two conventional pin-type connectors in back-to-back relation.

FIG. 5 illustrates the general arrangement wherein cable 14 is electrically interposed between panel 16 and tester 30. In the cable-test operation the testing voltage is supplied by vehicle voltage source 10. The wires in cable 12 extend into cable 14 for eventual connection to connection points M and A in panel 16; the "amplifier" end of cable 14 has no conductors in the zones designated M and A in FIG. 5. Power is supplied from panel 16 to tester housing 30 through connection points B, G and H. Connection points A,A are inactive.

Prior to making the cable test the ends of conductors 41 and 43 are spliced together. Switch 44 is set to the FIG. 5 position. The cable test is performed in essentially the same fashion as the panel 16 test. The lamps on tester 30 and panel 16 indicate cable failure.

FEATURES OF THE INVENTION

The testers shown in FIGS. 4 and 7 are designed for versatility and relatively low cost. They can be used to test the integrity of panel 16 and/or cable 14. They are sufficiently small as to be used for testing panel 16 in its installed position on the vehicle.

The tester is a hand-manipulatable implement that can be readily transported into a vehicle to perform on-board testing. The same tester implement can be used for bench testing of panel 16 and/or cable 14.

We wish it to be understood that we do not desire to be limited to the exact details of construction shown and described for obvious modifications will occur to a person skilled in the art, without departing from the spirit and scope of the appended claims.

We claim:

1. A method to check electrical continuity in a control panel and in a cable connecting the control panel to fire supression system components of a military vehicle, wherein access to the panel is limited and obstructed by surrounding vehicle elements, wherein the panel has first panel lines for sending power to the components, second panel lines for receiving current from the components, a third panel line for receiving electrical current from an electrical power source, panel lights in grounded end segments of the second and third panel lines for indicating receipt of current in the second and third panel lines, a light checking circuit connecting the panel lights in parallel, means to prevent current in the grounded end segments from entering the remaining portions of the second and third panel lines, a panel switch connected to the third panel line having a first position to energize the light checking circuit and a second position to energize the first panel lines, and wherein the cable has first cable lines for connecting the first panel lines to the components and has second cable lines for connecting the components and a power source to the second panel lines, the method comprising:

providing a test mechanism having a source of electrical power independent of the source of electrical power for the panel, a pair of terminal lines for detachably connecting the test mechanism to the independant source of electrical power, first test lines corresponding to respective first panel lines, test lights in the first test lines, second test lines corresponding to respective second panel lines, a test switch having one position for connecting the independent power source to the light checking circuit and another position for simultaneously connecting the independent source of electrical power to all the second test lines, the test mechanism being shaped as a tube no greater than about five inches in length;

attaching the test mechanism to the panel so that the first test lines connect with the respective first lines of the panel and the second test lines connect with respective second lines of the panel;

placing the panel switch in the first position wherein the light checking circuit is tested;

placing the test switch in the one position and then detecting which panel lights illuminate;

placing the panel switch in the second position to energize the first panel lines;

moving the test switch from the one position to the other position, thereby de-energizing the light checking circuit and sending current to all the second panel lines, and then detecting which panel lights are illuminated;

removing the test mechanism from the panel;

attaching the cable to the panel so that the second cable lines connect with the second panel lines;

disconnecting the terminal lines of the test mechanism from the independant power source and then connecting the ends of the terminal lines together;

attaching the test mechanism to the free end of the cable and disconnecting the terminal lines of the test mechanism from the independant power source, the first test lines of the test mechanism being connected in series with respective first cable lines and first panel lines;

detect which of the test lights is illuminated;

detect which of the panel lights is illuminated.

* * * * *